(12) United States Patent
Tu et al.

(10) Patent No.: US 6,995,403 B2
(45) Date of Patent: Feb. 7, 2006

(54) LIGHT EMITTING DEVICE

(75) Inventors: Chuan-Cheng Tu, Taipei (TW); Cheng-Chung Young, Changhua (TW); Pao-I Huang, Chiayi (TW); Jen-Chau Wu, Hsinchu (TW)

(73) Assignee: United Epitaxy Company, Ltd., (TW)

( * ) Notice: Subject to any disclaimer, the term of this patent is extended or adjusted under 35 U.S.C. 154(b) by 128 days.

(21) Appl. No.: 10/655,150

(22) Filed: Sep. 3, 2003

(65) Prior Publication Data

US 2005/0045906 A1 Mar. 3, 2005

(51) Int. Cl.
*H01L 29/22* (2006.01)
*H01L 29/221* (2006.01)
*H01L 29/225* (2006.01)
*H01L 29/24* (2006.01)
*H01L 29/739* (2006.01)

(52) U.S. Cl. .............................. 257/94; 257/96; 257/97; 257/103; 257/201

(58) Field of Classification Search .................. 257/94, 257/96, 97, 103, 201
See application file for complete search history.

(56) References Cited

U.S. PATENT DOCUMENTS

| | | | | |
|---|---|---|---|---|
| 5,739,554 A | * | 4/1998 | Edmond et al. ............. | 257/103 |
| 5,925,897 A | * | 7/1999 | Oberman ..................... | 257/80 |
| 5,977,566 A | * | 11/1999 | Okazaki et al. ............... | 257/99 |
| 6,078,064 A | * | 6/2000 | Ming-Jiunn et al. ........ | 257/103 |
| 6,120,600 A | * | 9/2000 | Edmond et al. ............. | 117/89 |
| 6,242,764 B1 | * | 6/2001 | Ohba et al. ................. | 257/190 |
| 6,287,947 B1 | * | 9/2001 | Ludowise et al. .......... | 438/606 |
| 6,465,808 B2 | * | 10/2002 | Lin ............................. | 257/81 |
| 6,667,498 B2 | * | 12/2003 | Makimoto et al. ......... | 257/183 |
| 2002/0195619 A1 | * | 12/2002 | Makimoto et al. ......... | 257/197 |
| 2003/0006418 A1 | * | 1/2003 | Emerson et al. ............ | 257/79 |
| 2003/0010993 A1 | * | 1/2003 | Nakamura et al. .......... | 257/99 |
| 2003/0164506 A1 | * | 9/2003 | Edmond et al. ............. | 257/83 |
| 2003/0164507 A1 | * | 9/2003 | Edmond et al. ............. | 257/85 |
| 2004/0051107 A1 | * | 3/2004 | Nagahama et al. .......... | 257/79 |
| 2004/0051108 A1 | * | 3/2004 | Nortrup ...................... | 257/82 |
| 2004/0089810 A1 | * | 5/2004 | Brown et al. ........... | 250/339.15 |
| 2004/0159842 A1 | * | 8/2004 | Edmond et al. ............. | 257/79 |
| 2005/0035362 A1 | * | 2/2005 | Nitta et al. .................. | 257/98 |
| 2005/0045906 A1 | * | 3/2005 | Tu et al. .................... | 257/103 |

* cited by examiner

*Primary Examiner*—David E. Graybill
(74) *Attorney, Agent, or Firm*—Michael A. Glenn; Glenn Patent Group

(57) ABSTRACT

A light emitting device is disclosed. The light emitting device comprises a contact layer and an oxide transparent layer located directly on the contact layer. The contact layer has a stacked structure formed by alternately stacking a plurality of nitride semiconductor layers having a wider bandgap and a plurality of nitride semiconductor layers having a narrower bandgap.

28 Claims, 1 Drawing Sheet

LIGHT EMITTING DEVICE

FIELD OF THE INVENTION

The present invention relates to a light emitting device, and more particularly, to a semiconductor light emitting device having high brightness and a low forward voltage.

BACKGROUND OF THE INVENTION

The metal oxide transparent conductive material, like indium tin oxide (ITO), nickel oxide (NiO) has been widely used on opto-electronic devices, such as thin film transistor liquid crystal display (TFT-LCD), organic light emitting device (OLED) and light emitting device especially in InGaN series material. It is used as a conductive window layer of the opto-electronic device for current spreading and light transmission. The major technical concerns is to seek low and stable operating forward voltage ($V_f$), since it is not easy to form ohmic contact between the indium tin oxide and p type GaN.

The forward voltage is lowered by applying an agent layer between the indium tin oxide and p type GaN. For example, the U.S. Pat. No. 5,977,566 filed by Okazaki et al. uses some metal, such as Mg, Ni, Au, Zn or Ti, as an agent layer. Besides, the U.S. Pat. No. 6,078,064 filed by Ming-Jiunn et al. uses a high doping p type contact layer, such as InGaN, GaAs, AlGaAs or GaP, as the agent layer.

However, the agent layer between the indium tin oxide and the p type GaN contact layer will absorb output light intensity, and the forward voltage is unstable during operation because the high doping concentration inside the agent layer results in carrier diffusion between the agent layer and the contact layer.

In addition, using an indium tin oxide layer as a current spreading layer to cover the Ni/Au transparent conductive layer so as to enhance the light output have been a well-known technique in the production of semiconductor opto-electronic devices. For example, the U.S. Pat. No. 5,925,897 filed by Oberman et al. adds a thin Au/Ni layer between the indium tin oxide layer and the p type InGaN contact layer. The U.S. Pat. No. 6,465,808 filed by Lin et al. uses a doted transparent conductive layer to decrease the absorption area, so as to achieve the objective of increasing the light output. Besides, the U.S. Pat. No. 6,287,947 filed by Ludowise et al. adds a multi-layered transparent conductive layer between the indium tin oxide layer and the p type GaN contact layer.

However, the aforementioned inventions all suffer a problem of poor reproducibility of forward voltage and current because of the difference of surface roughness of epiwafer or the variation of hydrogen passivation effect.

SUMMARY OF THE INVENTION

An objective of the present invention is to provide a light emitting device structure with a transparent conductive layer sitting on the semiconductor layers, so no agent layer between the transparent conductive layer and the semiconductor layers is required to get stable operating voltage and excellent light transmission. In this invention, the transparent conductive layer can be any kind of metal oxide material, like ITO, NiO, ZnO, $RuO_2$ or $IrO_2$, etc., while their work function is higher than 4.5 eV after treatment when they are used in InGaN material devices. The top layer of semiconductor part comprises a hybrid superlattice structure, wherein the hybrid superlattice structure comprises a first supperlattice structure composed of two to five pairs of wide bandgap material layers and narrow bandgap material layers, such as AlGaN Layer/GaN Layer, located on a cladding layer. Since the voltage is determined by the first contact width proposed in this invention, not by the interface dopant concentration, the reliable steady voltage is predicted. The brightness of the light emitting device can be enhanced since the first supperlattice structure can spread hole carriers.

Another objective of the present invention is to provide a light emitting device, and the hybrid superlattice structure of the contact layer comprises a second supperlattice structure composed of one to two pairs of wide bandgap material layer and narrow bandgap material layer, such as GaN Layer/InGaN Layer, located on the first supperlattice structure. In this invention, the thickness, not the doping concentration, of the second supperlattice structure can provide a tunneling contact for p type carriers or n type carriers, the forward voltage difference can be designed and kept constant, so as to keep the forward voltage stable.

According to the aforementioned objectives of the present invention, the present invention provides a light emitting device comprising: a contact layer, wherein the contact layer comprises a first superlattice structure and a second superlattice structure located directly on the first superlattice structure, and the first superlattice structure comprises a plurality of wide bandgap nitride semiconductor layers and a plurality of narrow bandgap nitride semiconductor layers alternatively stacked, and the second superlattice structure comprises at least one wide bandgap nitride semiconductor layer and at least one narrow bandgap nitride semiconductor layer alternatively stacked; and a transparent conductive layer located directly on a surface of the second superlattice structure of the contact layer.

According to a preferred embodiment of the present invention, the material of the wide bandgap nitride semiconductor layers of the first superlattice structure is AlGaN, and the material of the narrow bandgap nitride semiconductor layers of the first superlattice structure is GaN. In addition, the quantity of the pairs of the wide and narrow bandgap nitride semiconductor layers of the first superlattice structure is between 2 and 5. The material of the wide bandgap nitride semiconductor layer of the second superlattice structure is GaN, and the material of the narrow bandgap nitride semiconductor layer of the second superlattice structure is InGaN, and the quantity of the pairs of the wide and narrow bandgap nitride semiconductor layers of the second superlattice structure is between 1 and 2.

In another preferred embodiment of the present invention, the first superlattice structure is composed of two to three first superlattice layers, wherein each of the first superlattice layers can be a stacked layer of AlGaN layer/GaN layer/AlGaN layer. The second superlattice structure is composed of one to two second superlattice layers, wherein each of the second superlattice layers can be a stacked layer of GaN layer/InGaN layer/GaN layer.

Because the first superlattice structure can spread carriers, and the carriers can tunnel the second superlattice structure, the brightness of the light emitting device can be enhanced, and a stable and low forward voltage can be obtained.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a light emitting device comprising a contact layer composed of a hybrid superlattice structure which can spread hole carriers and provide tunneling contact for the carriers. In addition, an oxide transparent layer can be directly deposited on the contact layer. Therefore, the brightness of the light emitting device can be enhanced, and a stable and low forward voltage can be obtained. In order to make the illustration of the present invention more explicitly and completely, the following description is stated with reference to the accompanying drawings of FIG. 1 and FIG. 2.

Figure 1:
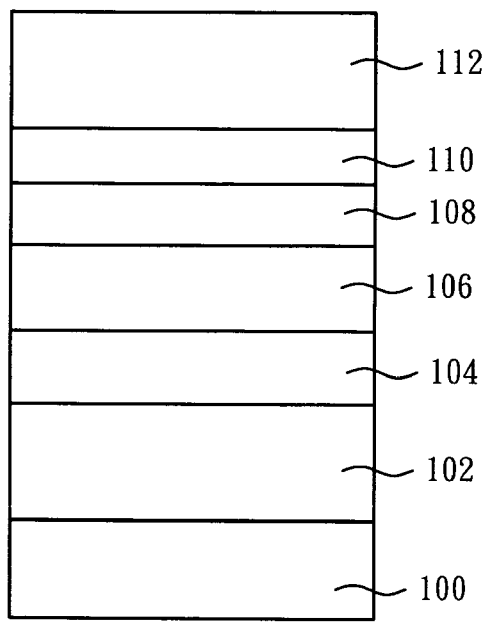
FIG. 1 illustrates a cross-sectional view of a light emitting device in accordance with a preferred embodiment of the present invention.

Referring to FIG. 1, FIG. 1 illustrates a cross-sectional view of a light emitting device in accordance with a preferred embodiment of the present invention. The light emitting device structure of the present invention comprises a substrate 100 which is transparent, a n type semiconductor layer 102, an active layer 104, a p type cladding layer 106, a superlattice structure 108, a superlattice structure 110 and a transparent conductive layer 112 stacked in sequence, wherein the superlattice structure 108 and the superlattice structure 110 constitute a contact layer, and the superlattice structure 108 and the superlattice structure 110 form a hybrid superlattice structure.

The material of the n type semiconductor layer 102 can be such as n type GaN, and the material of the p type cladding layer 106 can be such as p type GaN, and the material of the transparent conductive layer 112 can be any kind of metal oxide material, such as indium tin oxide, NiO, ZnO, RuO2 or IrO2, etc., while their work function is higher than 4.5 eV after treatment when they are used in InGaN material devices. Besides, the superlattice structure 108 can be, for example, composed of two to five pairs of wide bandgap semiconductor material layers and narrow bandgap semiconductor material layers alternatively stacked, wherein the material of the wide bandgap semiconductor material layers and the narrow bandgap semiconductor material layers can be such as p type doping nitride semiconductor. In the preferred embodiment, the material of the wide bandgap semiconductor material layers of the superlattice structure 108 is AlGaN, and the material of the narrow bandgap semiconductor material layers of the superlattice structure 108 is GaN. However, the superlattice structure 108 can also be composed of two to three sets of wide bandgap semiconductor material layer, narrow bandgap semiconductor material layer and wide bandgap semiconductor material layer stacked in sequence, wherein the material of the wide bandgap semiconductor material layer and that of the narrow bandgap semiconductor material layer can be such as p type doping nitride semiconductor, and the material of the two wide bandgap semiconductor material layers is AlGaN preferably, and the material of the narrow bandgap semiconductor material layer located between the two wide bandgap semiconductor material layers is GaN preferably.

In addition, the thickness of the wide bandgap semiconductor material layer of the superlattice structure 108 is preferably less than 100 Å, and the thickness of the narrow bandgap semiconductor material layer of the superlattice structure 108 is preferably less than 500 Å.

Because the superlattice structure 108 can spread hole carriers, the brightness of the light emitting device can be enhanced.

The superlattice structure 110 can be, for example, composed of one to two pairs of wide bandgap semiconductor material layer and narrow bandgap semiconductor material layer alternatively stacked, wherein the material of the wide and narrow bandgap semiconductor material layers can be such as p type doping nitride semiconductor. In the preferred embodiment, the material of the wide bandgap semiconductor material layers of the superlattice structure 110 is GaN, and the material of the narrow bandgap semiconductor material layers of the superlattice structure 110 is InGaN. However, the superlattice structure 110 can also be composed of one to two sets of wide bandgap semiconductor material layer, narrow bandgap semiconductor material layer and wide bandgap semiconductor material layer stacked in sequence, wherein the material of the wide bandgap semiconductor material layer and the narrow bandgap semiconductor material layer can be such as p type doping nitride semiconductor, and the material of the two wide bandgap semiconductor material layers is GaN preferably, and the material of the narrow bandgap semiconductor material layer located between the two wide bandgap semiconductor material layers is InGaN preferably.

Furthermore, the thickness of the wide bandgap semiconductor material layer of the superlattice structure 110 is preferably less than 100 Å, and the thickness of the narrow bandgap semiconductor material layer of the superlattice structure 110 is preferably less than 500 Å preferably. Besides, the top layer of the superlattice structure 110 is a wide bandgap semiconductor material layer preferably, and the thickness of the wide bandgap semiconductor material layer, the top layer of the superlattice structure 110, is less than 50 Å preferably.

The superlattice structure 110 can provide tunneling contact for carriers, so that the forward voltage difference can be designed and kept constant to obtain a low forward voltage. Additionally, the transparent conductive layer 112 can have good contact with the superlattice structure 110 without relying on a metal agent layer or high doping agent layer while the transparent conductive layer 112 is located directly on the superlattice structure 110 of the contact layer, so that the issue about the agent layer absorbing the output light does not exist, and the carriers can be restrained to keep the forward voltage stable.

Figure 2:
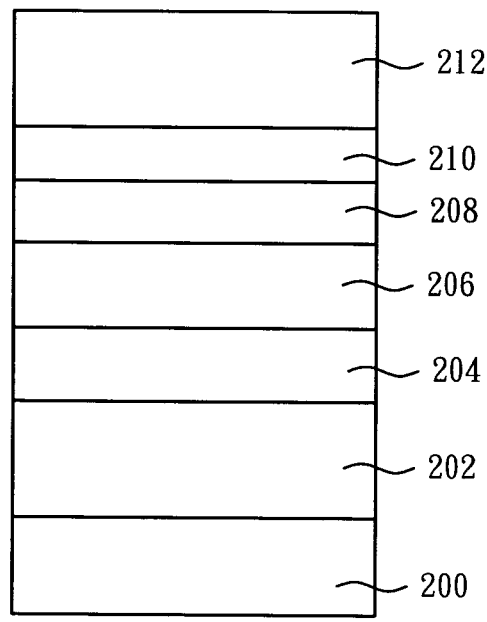
FIG. 2 illustrates a cross-sectional view of a light emitting device in accordance with the other preferred embodiment of the present invention.

Referring to FIG. 2, FIG. 2 illustrates a cross-sectional view of a light emitting device in accordance with the other preferred embodiment of the present invention. The light emitting device structure according to the other preferred embodiment of the present invention comprises a substrate 200 which is transparent, a p type semiconductor layer 202, an active layer 204, a n type cladding layer 206, a superlattice structure 208, a superlattice structure 210 and a transparent conductive layer 212 stacked in sequence, wherein the superlattice structure 208 and the superlattice structure 210 constitute a contact layer, and the superlattice structure 208 and the superlattice structure 210 form a hybrid superlattice structure.

The material of the p type semiconductor layer 202 can be such as p type GaN, and the material of the n type cladding layer 206 can be such as n type GaN, and the material of the transparent conductive layer 212 can be such as indium tin oxide. Similarly, the superlattice structure 208 can be, for example, composed of two to five pairs of wide bandgap semiconductor material layer and narrow bandgap semiconductor material layer alternatively stacked, and the superlattice structure 208 can also be composed of two to three sets of wide bandgap semiconductor material layer, narrow bandgap semiconductor material layer and wide bandgap semiconductor material layer stacked in sequence. In the preferred embodiment, the material of the wide and narrow bandgap semiconductor material layers of the superlattice structure 208 can be such as n type nitride semiconductor, and the material of the wide bandgap semiconductor material layers of the superlattice structure 208 is AlGaN, and the material of the narrow bandgap semiconductor material layers of the superlattice structure 208 is GaN. In addition, the thickness of the wide bandgap semiconductor material layer of the superlattice structure 208 is preferably less than 100 Å, and the thickness of the narrow bandgap semiconductor material layer of the superlattice structure 208 is less than 500 Å preferably. The superlattice structure 208 can spread hole carriers, so that the brightness of the light emitting device can be enhanced.

Besides, the superlattice structure 210 can be, for example, composed of one to two pairs of wide bandgap semiconductor material layer and narrow bandgap semiconductor material layer alternatively stacked, and the superlattice structure 210 can also be composed of one to two sets of wide bandgap semiconductor material layer, narrow bandgap semiconductor material layer and wide bandgap semiconductor material layer stacked in sequence similarly. In the preferred embodiment, the material of the wide and narrow bandgap semiconductor material layers can be such as n type doping nitride semiconductor, and the material of the wide bandgap semiconductor material layers of the superlattice structure 210 is GaN, and the material of the narrow bandgap semiconductor material layers of the superlattice structure 210 is InGaN. Furthermore, the thickness of the wide bandgap semiconductor material layer of the superlattice structure 210 is preferably less than 100 Å, and the thickness of the narrow bandgap semiconductor material layer of the superlattice structure 210 is preferably less than 500 Å preferably. Besides, the top layer of the superlattice structure 210 is a wide bandgap semiconductor material layer preferably, and the thickness of the wide bandgap semiconductor material layer in the top of the superlattice structure 210 is less than 50 Å preferably.

The superlattice structure 210 can provide tunneling contact for carriers, and the transparent conductive layer 212 can have good contact with the superlattice structure 210 without relying on a metal agent layer or high doping agent layer while the transparent conductive layer 212 is located directly on the superlattice structure 210 of the contact layer. Therefore, the issue about the agent layer absorbing the output light does not exist, and the carriers can be restrained to obtain a low and stable forward voltage.

According to the aforementioned description, one advantage of the present invention is that: because the contact layer of the light emitting device of the present invention comprises a hybrid superlattice structure, and a first superlattice structure of the hybrid superlattice structure can spread hole carriers, the brightness of the light emitting device can be enhanced.

According to the aforementioned description, the other advantage of the present invention is that: because the second superlattice structure of the light emitting device of the present invention can be tunneled by p type carriers or n type carriers, and the transparent conductive layer can be deposited directly on the second superlattice structure, the carriers can be restrained to obtain a low and stable forward voltage.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light emitting device, comprising:
    an active layer;
    a contact layer deposed on the active layer, wherein the contact layer comprises a first superlattice structure and a second superlattice structure located directly on the first superlattice structure, and the first superlattice structure comprises a plurality of wide bandgap nitride semiconductor layers and a plurality of narrow bandgap nitride semiconductor layers alternatively stacked, and the second superlattice structure comprises at least one wide bandgap nitride semiconductor layer and at least one narrow bandgap nitride semiconductor layer alternatively stacked; and
    a transparent conductive layer located directly on a surface of the second superlattice structure of the contact layer.

2. The light emitting device according to claim 1, wherein the material of the wide bandgap nitride semiconductor layers of the first superlattice structure is AlGaN.

3. The light emitting device according to claim 1, wherein the material of the narrow bandgap nitride semiconductor layers of the first superlattice structure is GaN.

4. The light emitting device according to claim 1, wherein the quantity of the wide bandgap nitride semiconductor layers of the first superlattice structure; and the narrow bandgap nitride semiconductor layers of the first superlattice structure is between 2 and 5.

5. The light emitting device according to claim 1, wherein a thickness of the wide bandgap nitride semiconductor layers of the first superlattice structure is less than 100 Å.

6. The light emitting device according to claim 1, wherein a thickness of the narrow bandgap nitride semiconductor layers of the first superlattice structure is less than 500 Å.

7. The light emitting device according to claim 1, wherein the material of the at least one wide bandgap nitride semiconductor layer of the second superlattice structure is GaN.

8. The light emitting device according to claim 1, wherein the material of the at least one narrow bandgap nitride semiconductor layer of the second superlattice structure is InGaN.

9. The light emitting device according to claim 1, wherein the quantity of the at least one wide bandgap nitride semiconductor layer of the second superlattice structure; and the at least one narrow bandgap nitride semiconductor layer of the second superlattice structure is between 1 and 2.

10. The light emitting device according to claim 1, wherein a thickness of the at least one wide bandgap nitride semiconductor layer of the second superlattice structure is less than 100 Å.

11. The light emitting device according to claim 1, wherein a thickness of the at least one narrow bandgap nitride semiconductor layer of the second superlattice structure is less than 500 Å.

12. The light emitting device according to claim 1, wherein the surface of the second superlattice structure is one of the at least one wide bandgap nitride semiconductor layer of the second superlattice structure.

13. The light emitting device according to claim 12, wherein a thickness of the one of the at least one wide bandgap nitride semiconductor layer of the second superlattice structure is less than 50 Å.

14. The light emitting device according to claim 1, wherein the material of the transparent conductive layer is selected from the group consisting of indium tin oxide, zinc oxide, $RuO_2$, $IrO_2$ and any metal oxide with work function be higher than 4.5 eV after a heat treatment.

15. A light emitting device, comprising:
   an active layer;
   a contact layer deposed on the active layer, wherein the contact layer comprises:
   a first superlattice structure, wherein the first superlattice structure comprises a plurality of first superlattice layers; and
   a second superlattice structure located on the first superlattice structure, wherein the second superlattice structure comprises at least one second superlattice layer; and
   a transparent conductive layer located directly on a surface of the second superlattice structure of the contact layer.

16. The light emitting device according to claim 15, wherein each of the first superlattice layers comprises a first wide bandgap nitride semiconductor layer, a narrow bandgap nitride semiconductor layer and a second wide bandgap nitride semiconductor layer stacked in sequence.

17. The light emitting device according to claim 16, wherein a thickness of the first wide bandgap nitride semiconductor layer and a thickness of the second wide bandgap nitride semiconductor layer in each of the first superlattice layers are less than 100 Å.

18. The light emitting device according to claim 16, wherein a thickness of the narrow bandgap nitride semiconductor layer in each of the first superlattice layers is less than 500 Å.

19. The light emitting device according to claim 15, wherein each of the first superlattice layers is a stacked structure of AlGaN layer/GaN layer/AlGaN layer.

20. The light emitting device according to claim 15, wherein the quantity of the first superlattice layers is between 2 and 3.

21. The light emitting device according to claim 15, wherein the at least one second superlattice layer comprises a first wide bandgap nitride semiconductor layer, a narrow bandgap nitride semiconductor layer and a second wide bandgap nitride semiconductor layer stacked in sequence.

22. The light emitting device according to claim 21, wherein a thickness of the first wide bandgap nitride semiconductor layer and a thickness of the second wide bandgap nitride semiconductor layer in the at least one second superlattice layer are less than 100 Å.

23. The light emitting device according to claim 21, wherein a thickness of the narrow bandgap nitride semiconductor layer in the at least one second superlattice layer is less than 500 Å.

24. The light emitting device according to claim 15, wherein the at least one second superlattice layer is a stacked structure of GaN layer/InGaN layer/GaN layer.

25. The light emitting device according to claim 15, wherein the quantity of the at least one second superlattice layer is between 1 and 2.

26. The light emitting device according to claim 15, wherein the surface of the second superlattice structure is a wide bandgap semiconductor layer.

27. The light emitting device according to claim 26, wherein a thickness of the wide bandgap semiconductor layer is less than 50 Å.

28. The light emitting device according to claim 15, wherein the material of the transparent conductive layer is selected from the group consisting of indium tin oxide, zinc oxide, $RuO_2$, $IrO_2$ and any metal oxide with work function be higher than 4.5 eV after a heat treatment.

* * * * *

UNITED STATES PATENT AND TRADEMARK OFFICE
CERTIFICATE OF CORRECTION

PATENT NO. : 6,995,403 B2 Page 1 of 1
APPLICATION NO. : 10/655150
DATED : February 7, 2006
INVENTOR(S) : Chuan-Cheng Tu et al.

It is certified that error appears in the above-identified patent and that said Letters Patent is hereby corrected as shown below:

On title page should read
[75] Inventors: Chuan-Cheng Tu, Taipei (TW); Cheng-Chung Yang, Changhua (TW); Pao-I Huang, Chiayi (TW); Jen-Chau Wu, Hsinchu (TW)

Signed and Sealed this

Twentieth Day of November, 2007

JON W. DUDAS
*Director of the United States Patent and Trademark Office*